(12) United States Patent
Sato

(10) Patent No.: US 10,530,070 B2
(45) Date of Patent: Jan. 7, 2020

(54) CONNECTING STRUCTURE OF OXIDE SUPERCONDUCTING WIRE AND METHOD OF MANUFACTURING THE SAME

(71) Applicant: FUJIKURA LTD., Tokyo (JP)

(72) Inventor: Hiroki Sato, Sakura (JP)

(73) Assignee: FUJIKURA LTD., Tokyo (JP)

( * ) Notice: Subject to any disclaimer, the term of this patent is extended or adjusted under 35 U.S.C. 154(b) by 191 days.

(21) Appl. No.: 15/507,174

(22) PCT Filed: Aug. 30, 2016

(86) PCT No.: PCT/JP2016/075348
§ 371 (c)(1),
(2) Date: Feb. 27, 2017

(87) PCT Pub. No.: WO2017/038826
PCT Pub. Date: Mar. 9, 2017

(65) Prior Publication Data
US 2017/0288323 A1    Oct. 5, 2017

(30) Foreign Application Priority Data

Sep. 4, 2015  (JP) ................. 2015-174663

(51) Int. Cl.
*H01R 4/68* (2006.01)
*H01F 6/06* (2006.01)
(Continued)

(52) U.S. Cl.
CPC ............... *H01R 4/68* (2013.01); *H01B 12/06* (2013.01); *H01B 13/00* (2013.01); *H01F 6/06* (2013.01)

(58) Field of Classification Search
CPC .......... H01R 4/68; H01B 12/06; H01B 13/00; H01L 39/02; Y02E 40/642
See application file for complete search history.

(56) References Cited

U.S. PATENT DOCUMENTS

2009/0298696 A1* 12/2009 Otto ...................... H01L 39/02
505/230
2010/0022396 A1   1/2010 Otto et al.
(Continued)

FOREIGN PATENT DOCUMENTS

CN    102105947 A    6/2011
CN    103688316 A    3/2014
(Continued)

OTHER PUBLICATIONS

"Metallic Materials—Tensile testing—Method of test at room temperature," ISO 6892-1:2009, JIS Z 2241: 2011, pp. 477-549 (37 pages).
(Continued)

*Primary Examiner* — Paul A Wartalowicz
(74) *Attorney, Agent, or Firm* — Osha Liang LLP

(57) ABSTRACT

A connecting structure of an oxide superconducting wire includes a pair of oxide superconducting wires, tip surfaces of the pair of oxide superconducting wire being disposed to face to each other; a first surface-connecting superconducting wire configured to transit and connect the pair of oxide superconducting wires; and a second surface transit connector configured to transit and connect the pair of oxide superconducting wires, wherein tensile strength of joining sections between the second surface transit connector and the pair of oxide superconducting wires is higher than tensile strength of joining sections between the first surface-connecting superconducting wire and the pair of oxide superconducting wires.

4 Claims, 7 Drawing Sheets

(51) Int. Cl.
*H01B 12/06* (2006.01)
*H01B 13/00* (2006.01)

(56) References Cited

U.S. PATENT DOCUMENTS

| | | |
|---|---|---|
| 2015/0045229 A1 | 2/2015 | Mitsuhashi et al. |
| 2015/0200041 A1 | 7/2015 | Mitsuhashi et al. |

FOREIGN PATENT DOCUMENTS

| | | |
|---|---|---|
| CN | 103688317 A | 3/2014 |
| DE | 102013212042 A1 | 1/2015 |
| JP | 3717683 B2 | 11/2005 |
| JP | 2007-266149 A | 11/2007 |
| JP | 2009-240100 A | 10/2009 |
| JP | 4810268 B2 | 11/2011 |
| JP | 2011529255 A | 12/2011 |
| JP | 2013243002 A | 12/2013 |
| JP | 2014-130788 A | 7/2014 |
| JP | 5701247 B2 | 4/2015 |
| WO | 2005/079220 A2 | 9/2005 |
| WO | 2010011739 A1 | 1/2010 |

OTHER PUBLICATIONS

Office Action issued in corresponding Chinese Application No. 201680002383.3 dated Oct. 30, 2017 (7 pages).
Extended European Search Report issued in corresponding European Application No. 16836219.2 dated Mar. 22, 2018 (8 pages).
Office Action issued in Japanese Application No. 2015-174663, dated Mar. 26, 2019 (3 pages).

* cited by examiner

CONNECTING STRUCTURE OF OXIDE SUPERCONDUCTING WIRE AND METHOD OF MANUFACTURING THE SAME

TECHNICAL FIELD

The present invention relates to a connecting structure of an oxide superconducting wire and a method of manufacturing the same.

Priority is claimed on Japanese Patent Application No. 2015-174663, filed Sep. 4, 2015, the content of which is incorporated herein by reference.

BACKGROUND ART

In recent years, development of an oxide superconducting wire (a high temperature superconducting wire) such as a Y-based superconducting wire (for example, using $REBa_2Cu_3O_{7-\delta}$ (a rare earth element such as RE123, RE:Y or the like)), a Bi-based superconducting wire (for example, using $Bi_2Sr_2CaCu_2O_{8+\delta}$ (Bi2212) or $Bi_2Sr_2Ca_2Cu_3O_{10+\delta}$ (Bi2223)), or the like, has been performed.

In general, a Y-based superconducting wire has an intermediate layer, a superconducting layer, and a stabilized layer formed of Cu or the like, which are sequentially formed on a base material in a tape shape. The stabilized layer functions as a current pass when current is transformed from superconduction to normal conduction for any reason.

Conventionally, the Y-based superconducting wire receives tensile strength in a longitudinal direction by using a base material formed of a material having high strength, such as a Ni alloy. In addition, in the Bi-based superconducting wire, using a metal base material having high strength to increase tensile strength has been proposed.

When the superconducting wire is used as a coil, a cable, or the like, in actuality, it may be necessary to connect a plurality of superconducting wires to each other (for example, see Patent Literatures 1 to 3).

When the superconducting coil is manufactured using the superconducting wire, conventionally, a surface on which the superconducting layer is disposed is provided as an inner circumferential surface, and a connecting structure is wound in a coil shape.

PRIOR ART DOCUMENTS

Patent Documents

[Patent Literature 1] Japanese Patent No. 3717683
[Patent Literature 2] Japanese Patent No. 4810268
[Patent Literature 3] Published Japanese Translation No. 2011-529255 of the PCT International Publication

DISCLOSURE OF INVENTION

Problems to be Solved by the Invention

For example, as shown in FIG. 13A, in a connecting structure 200, a pair of superconducting wires 101 and 102 is connected via a superconducting wire 103. When a tensile force in a lengthwise direction of the superconducting wires 101 and 102 is applied to the connecting structure 200, a direction of the tensile force and a direction of a line (a broken line) passing through a center of gravity in a thickness direction of the wire do not coincide with each other at a connecting portion. In addition, the connecting portion has high flexural rigidity because the wires overlap each other. For this reason, as shown in FIG. 13B, when the tensile force is large, the wire sometimes largely bends in the vicinity of an end portion of the connecting portion.

FIG. 14A is a cross-sectional view showing a specific example of the connecting structure 200. The superconducting wires 101 to 103 include tape-shaped base materials 10, 20 and 30, intermediate layers 11, 21 and 31, oxide superconducting layers 12, 22 and 32, and stabilized layers 13, 23 and 33, respectively. The superconducting wires 101 and 102 and the superconducting wire 103 are connected to each other via a soldered layer 34.

FIG. 14B is an enlarged view of a connecting portion (a portion surrounded by an ellipse of FIG. 14A) between the superconducting wire 101 and the superconducting wire 103, showing stress generated at the connecting portion when a tensile load is applied to the connecting structure 200. In FIG. 14B, a magnitude of stress is represented by gradation of hatching, and the color darkens as stress increases. As shown in FIG. 14B, in the vicinity of the end portion of the connecting portion of the superconducting wires 101 and 103, stress is concentrated on the superconducting wire 101 and also bending occurs.

In this way, as the bending occurs while the stress is concentrated on the end portion of the connecting portion, a measurement result in which a superconduction property is decreased in the connecting structure 200 when a load equal to or smaller than 70% of the strength of the wire itself is applied is obtained. Further, the dependency of a superconduction property on tensile strength varies even due to a minute structure in which a distribution quantity or the like of a soldering (the soldered layer 34) of the connecting portion. For this reason, in the connecting structure 200, a stabilized superconduction property cannot be easily obtained.

In particular, when the superconducting coil is manufactured using the connecting structure 200, the superconduction property is decreased due to a tensile load applied to the connecting structure 200 and is likely to be unstable.

The present invention is directed to providing a connecting structure of an oxide superconducting wire and a method of manufacturing the same that are capable of preventing destabilization of a superconduction property due to a tensile load.

Means for Solving the Problems

A connecting structure of an oxide superconducting wire rod according to a first aspect of the present invention includes a pair of oxide superconducting wires each having a first oxide superconducting layer and a first stabilized layer, which are sequentially deposited on a first tape-shaped base material, tip surfaces of the pair of oxide superconducting wire being disposed to face to each other, a first surface-connecting superconducting wire having a second oxide superconducting layer and a second stabilized layer, which are sequentially deposited on a second tape-shaped base material, and configured to transit and connect the pair of oxide superconducting wires; and a second surface transit connector configured to transit and connect the pair of oxide superconducting wires, wherein the first surface-connecting superconducting wire is joined to the pair of oxide superconducting wires such that the second stabilized layer faces to the first stabilized layer of the pair of oxide superconducting wires, the second surface transit connector is joined to the pair of oxide superconducting wires to face to the first base material of the pair of oxide superconducting wires, and tensile strength of joining sections between the second surface transit connector and the pair of oxide superconducting wires is higher than tensile strength of joining sections between the first surface-connecting superconducting wire and the pair of oxide superconducting wires.

According to the above-mentioned configuration, the first surface-connecting superconducting wire and the second surface transit connector are provided on one surface and the other surface of the pair of oxide superconducting wires, respectively. For this reason, a deviation on a structure in a thickness direction of the pair of oxide superconducting wires is reduced. For this reason, stress concentration and folding of the wire is reduced even when a tensile load is applied, and a decrease in a superconduction property can be prevented.

In addition, according to the above-mentioned configuration, the tensile strength of the joining section of the second surface transit connector is set to be higher than the tensile strength of the joining section of the first surface-connecting superconducting wire. For this reason, a decrease in a superconduction property can be prevented without causing damage to the connecting portion even when the tensile load is applied to the connecting structure in a coil shape.

In the first aspect, the second surface transit connector may be formed to be longer than the first surface-connecting superconducting wire in a lengthwise direction of the pair of oxide superconducting wires, and both end portions of the joining regions of the second surface transit connector with respect to the pair of oxide superconducting wires may be disposed further outside than both end portions of the joining regions of the first surface-connecting superconducting wire with respect to the pair of oxide superconducting wires in the lengthwise direction of the pair of oxide superconducting wires.

According to the above-mentioned configuration, a joining area of the second surface transit connector with respect to the oxide superconducting wire is increased. For this reason, the tensile strength of the joining section of the second surface transit connector can be reliably larger than the tensile strength of the joining section of the first surface-connecting superconducting wire. Accordingly, the above-mentioned effect of preventing a decrease in a superconduction property can be reliably obtained.

In the first aspect, the second surface transit connector may be an oxide superconducting wire having a third oxide superconducting layer and a third stabilized layer, which are sequentially deposited on a third tape-shaped base material.

According to the above-mentioned configuration, the oxide superconducting wire having the same configuration as the oxide superconducting wire and the first surface-connecting superconducting wire may be used as the second surface transit connecting body. For this reason, kinds of components can be reduced, and manufacture thereof becomes easy.

The second surface transit connector may be a metal layer having a single layer structure.

According to the above-mentioned configuration, the second surface transit connector having high strength/high stiffness and a small thickness can be used. Accordingly, the connecting structure can be thinned while securing the connecting strength.

The tip surfaces of the pair of oxide superconducting wires may be disposed to face to each other with a gap.

According to the above-mentioned configuration, when bending is applied to the connecting structure, distortion can be absorbed by the gap. For this reason, an excessive force is not applied to the connecting portion and damage can be avoided.

A method of manufacturing a connecting structure of an oxide superconducting wire according to a second aspect of the present invention includes preparing a pair of oxide superconducting wires each having a first oxide superconducting layer and a first stabilized layer, which are sequentially deposited on a first tape-shaped base material, a first surface-connecting superconducting wire having a second oxide superconducting layer and a second stabilized layer, which are sequentially deposited on a second tape-shaped base material, and a second surface transit connector; disposing the pair of oxide superconducting wires such that tip surfaces thereof face to each other; joining the first surface-connecting superconducting wire to the pair of oxide superconducting wires such that the second stabilized layer faces to the first stabilized layer of the pair of oxide superconducting wires; joining the second surface transit connector to the pair of oxide superconducting wires to face to the first base material of the pair of oxide superconducting wires; and setting tensile strength of joining sections between the second surface transit connector and the pair of oxide superconducting wires to be larger than tensile strength of joining sections between the first surface-connecting superconducting wire and the pair of oxide superconducting wires, when the first surface-connecting superconducting wire and the second surface transit connector are joined to the pair of oxide superconducting wires.

According to the method, the connecting structure of the oxide superconducting wire capable of preventing a decrease in a superconduction property even when a tensile load is applied can be easily manufactured.

Effects of the Invention

According to the aspect of the present invention, the first surface-connecting superconducting wire is provided at the surface of one of the pair of oxide superconducting wires, and the second surface transit connector is provided at the other surface of the pair of oxide superconducting wires. For this reason, stress concentration and folding of the wire are decreased even when the tensile load is applied, and a decrease in a superconduction property can be prevented.

In addition, the tensile strength of the joining section of the second surface transit connector is larger than the tensile strength of the joining section of the first surface-connecting superconducting wire. For this reason, a decrease in a superconduction property can be prevented without causing damage to the connecting portion even when the tensile load is applied when it is wound in a coil shape.

EMBODIMENTS FOR CARRYING OUT THE INVENTION

Figure 1:
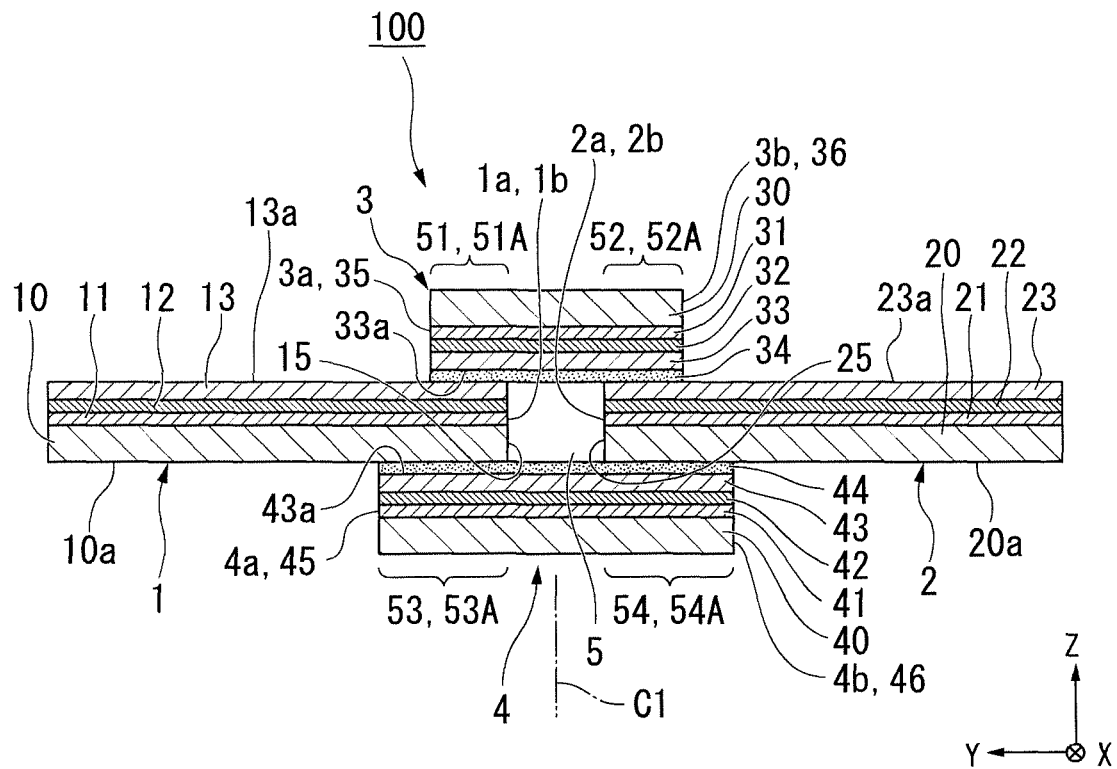
FIG. 1 is a cross-sectional view schematically showing a connecting structure of an oxide superconducting wire according to a first embodiment of the present invention in a lengthwise direction.

Hereinafter, a connecting structure of an oxide superconducting wire according to an embodiment of the present invention will be described. Further, in order to facilitate understanding of features, feature portions may be enlarged in the drawings used for the following description for the convenience of description and are not limited as long as a dimension ratio of components is the same as in actuality. In addition, in some drawings, an XYZ coordinate system in which a widthwise direction of a wire is an X direction, a longitudinal direction is a Y direction and a thickness direction is a Z direction is provided.

[Oxide Superconducting Wire]

Figure 2:
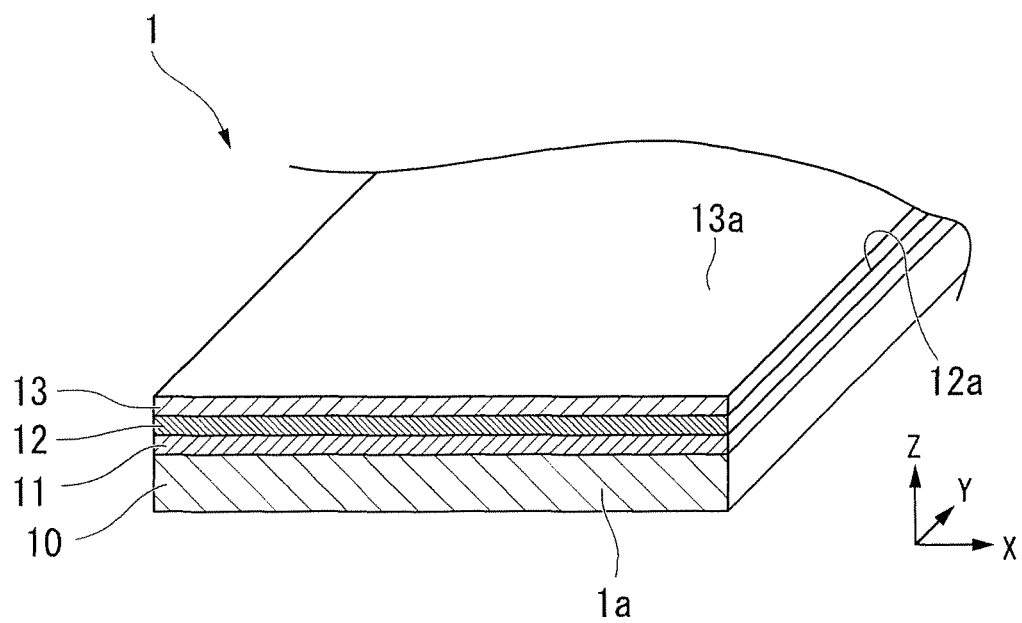
FIG. 2 is a perspective view schematically showing a tip portion of the oxide superconducting wire used in the connecting structure of FIG. 1.

FIG. 2 is a perspective view schematically showing a tip portion of an oxide superconducting wire 1 used in a connecting structure of an oxide superconducting wire according to a first embodiment of the present invention. The oxide superconducting wire 1 has a structure in which an intermediate layer (a first intermediate layer) 11, an oxide superconducting layer (a first oxide superconducting layer) 12, and a stabilized layer (a first stabilized layer) 13 (a metal layer) are sequentially deposited on a tape-shaped base material (a first base material) 10.

The base material 10 is formed of a nickel alloy represented by Hastelloy (Trademark of Hanes Inc. in the US); stainless steel; a textured Ni—W alloy in which an aggregate structure is introduced into a nickel alloy; or the like. A thickness of the base material 10 may be within, for example, a range of 10 to 500 μm.

The intermediate layer 11 is formed on the base material 10. The intermediate layer 11 may have, for example, a structure in which a diffusion prevention layer, a bed layer, a textured layer and a cap layer are sequentially deposited from a base material side. One or both of the diffusion prevention layer and the bed layer may be omitted. The diffusion prevention layer is formed of $Si_3N_4$, $Al_2O_3$, GZO ($Gd_2Zr_2O_7$), or the like, and formed to have, for example, a thickness of 10 to 400 nm. The bed layer is a layer configured to reduce interface reactivity and obtain an orientation of a film formed thereon. The bed layer is formed of $Y_2O_3$, $Er_2O_3$, $CeO_2$, $Dy_2O_3$, $Er_2O_3$, $Eu_2O_3$, $Ho_2O_3$, $La_2O_3$, or the like, and a thickness thereof may be, for example, 10 to 100 nm. The oriented layer is formed of a biaxially-textured material to control a crystalline orientation of the cap layer thereon. A material of the textured layer may be exemplified as a metal oxide such as $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $Zr_2O_3$, $Ho_2O_3$, $Nd_2O_3$, or the like. The textured layer may be formed by an ion-beam-assisted deposition (IBAD) method. The cap layer is formed of a material which can form a film on a surface of the textured layer and a crystal grain can be self-oriented in an in-plane direction. Specifically, the cap layer is formed of $CeO_2$, $Y_2O_3$, $Al_2O_3$, $Gd_2O_3$, $ZrO_2$, YSZ, $Ho_2O_3$, $Nd_2O_3$, $LaMnO_3$, or the like. A film thickness of the cap layer may be within a range of 50 to 5000 nm.

The oxide superconducting layer 12 may be a known oxide superconducor. Specifically, $REBa_2Cu_3O_{7-X}$ referred to as RE-123 (RE represents one or two or more of Y, La, Ce, Pr, Nd, Pm, Sm, Eu, Gd, Tb, Dy, Ho, Er, Tm, Yb and Lu, which are rare earth elements) may be exemplified as the oxide superconducting layer 12. Y123 ($YBa_2Cu_3O_{7-X}$), Gd123 ($GdBa_2Cu_3O_{7-X}$), or the like, is exemplified as a specific example of the oxide superconducting layer 12. While a mother material is an insulating body, the copper oxide superconductor becomes the oxide superconducting body in which a crystalline structure is arranged by incorporating oxygen through oxygen annealing processing and has a characteristic of showing a superconduction property.

It is preferable that a thickness of the oxide superconducting layer 12 be about 0.5 to 5 μm and the thickness be uniform.

The stabilized layer 13 is formed on an upper surface 12a of the oxide superconducting layer 12. A structure in which a second layer formed of Cu or a Cu alloy (a Cu—Zn alloy, a Cu—Ni alloy, or the like) is deposited on a first layer formed of Ag or an Ag alloy is exemplified as the stabilized layer 13. The first layer formed of Ag or an Ag alloy is formed by, for example, a sputtering method or the like. The second layer formed of Cu or a Cu alloy is formed by, for example, plating, a tape material, or the like. The stabilized layer 13 functions as a current pass when current is transformed from superconduction to normal conduction for any reason. The stabilized layer 13 is formed to have a thickness of, for example, 1 μm to 100 μm.

Connecting Structure of First Embodiment

A connecting structure 100 serving as the connecting structure of the oxide superconducting wire according to the first embodiment of the present invention will be described with reference to FIG. 1.

As shown in FIG. 1, the connecting structure 100 is a structure body in which the first oxide superconducting wire 1 and a second oxide superconducting wire 2 are connected. Specifically, the connecting structure 100 has the first and second oxide superconducting wires 1 and 2, a first surface-connecting superconducting wire 3, and a second surface-connecting superconducting wire 4 (a second surface transit connector).

The second oxide superconducting wire 2 has a structure in which an intermediate layer (a first intermediate layer) 21, an oxide superconducting layer (a first oxide superconducting layer) 22 and a stabilized layer (a first stabilized layer) 23 are sequentially deposited on a base material (a first base material) 20. Since the base material 20, the intermediate layer 21, the oxide superconducting layer 22 and the stabilized layer 23 have the same configurations as the base material 10, the intermediate layer 11, the oxide superconducting layer 12 and the stabilized layer 13 of the oxide superconducting wire 1, description thereof will be omitted.

Further, surfaces 13a and 23a of the stabilized layers 13 and 23 of the oxide superconducting wires 1 and 2 are first surfaces of the oxide superconducting wires 1 and 2, and surfaces 10a and 20a of the base materials 10 and 20 are second surfaces of the oxide superconducting wires 1 and 2. The second surfaces are opposite to the first surfaces.

The first and second oxide superconducting wires 1 and 2 are disposed so that the tip surfaces 1a and 2a face to each other. A gap 5 is secured between the tip surface 1a and the tip surface 2a.

The first surface-connecting superconducting wire 3 has a structure in which an intermediate layer 31, an oxide superconducting layer (a second oxide superconducting layer) 32 and a stabilized layer (a second stabilized layer) 33 are sequentially deposited on a base material (a second base material) 30. Since the base material 30, the intermediate layer 31, the oxide superconducting layer 32 and the stabilized layer 33 have the same configurations as the base material 10, the intermediate layer 11, the oxide superconducting layer 12 and the stabilized layer 13 of the oxide superconducting wire 1, description thereof will be omitted.

The first surface-connecting superconducting wire 3 is joined to the oxide superconducting wires 1 and 2 in a state in which the stabilized layer 33 faces to the stabilized layers 13 and 23 of the first and second oxide superconducting wires 1 and 2. Accordingly, the oxide superconducting wires 1 and 2 are connected via the first surface-connecting superconducting wire 3 on the first surfaces (the surfaces 13a and 23a).

The stabilized layer 33 of a portion (one end portion 35) including the one end 3a of the first surface-connecting superconducting wire 3 overlaps the surface 13a of the stabilized layer 13 of a portion (a tip portion 15) including a tip 1b of the oxide superconducting wire 1, and is joined to the stabilized layer 13 via the soldered layer 34. The stabilized layer 33 of a portion (the other end portion 36) including the other end 3b of the first surface-connecting superconducting wire 3 overlaps the surface 23a of the stabilized layer 23 of a portion (a tip portion 25) including a tip 2b of the oxide superconducting wire 2, and is joined to the stabilized layer 23 via the soldered layer 34.

A portion at which the one end portion 35 of the first surface-connecting superconducting wire 3 and the tip portion 15 of the oxide superconducting wire 1 are joined is referred to as a joining section 51A, and a region thereof is referred to as a first joining region 51. A portion at which the other end portion 36 of the first surface-connecting superconducting wire 3 and the tip portion 25 of the oxide superconducting wire 2 are joined is referred to as a joining section 52A, and a region thereof is referred to as a second joining region 52. In the joining regions 51 and 52, it is preferable that the first surface-connecting superconducting wire 3 be joined throughout widths of the oxide superconducting wires 1 and 2. The soldered layer 34 may also be formed throughout a surface 33a of the stabilized layer 33 or may be formed at only the joining regions 51 and 52.

The first surface-connecting superconducting wire 3 transits and connects the oxide superconducting wires 1 and 2 through connection of the one end portion 35 and the other end portion 36 to the oxide superconducting wires 1 and 2, respectively.

The second surface-connecting superconducting wire 4 has a structure in which an intermediate layer 41, an oxide superconducting layer 42 and a stabilized layer 43 are sequentially deposited on a base material 40. Since the base material 40, the intermediate layer 41, the oxide superconducting layer 42 and the stabilized layer 43 have the same configurations as the base material 10, the intermediate layer 11, the oxide superconducting layer 12 and the stabilized layer 13 of the oxide superconducting wire 1, description thereof will be omitted.

The second surface-connecting superconducting wire 4 is joined to the oxide superconducting wires 1 and 2 in a state in which the stabilized layer 43 faces to the base materials 10 and 20 of the first and second oxide superconducting wires 1 and 2. Accordingly, the first and second oxide superconducting wires 1 and 2 are connected via the second surface-connecting superconducting wire 4 on the surface (the second surface) opposite to the first surface-connecting superconducting wire 3.

The second surface-connecting superconducting wire 4 has the same structure as the first oxide superconducting wire 1, and has a structure in which the intermediate layer 41, the oxide superconducting layer 42 and the stabilized layer 43 are deposited on the base material 40. The second surface-connecting superconducting wire 4 is joined to the oxide superconducting wires 1 and 2 in a state in which the stabilized layer 43 faces the base materials 10 and 20 of the first and second oxide superconducting wires 1 and 2. Accordingly, the oxide superconducting wires 1 and 2 are connected via the second surface-connecting superconducting wire 4 on the second surfaces (the surfaces 10a and 20a).

The stabilized layer 43 of a portion (one end portion 45) including one end 4a of the second surface-connecting superconducting wire 4 overlaps the surface 10a of the base material 10 of the portion (the tip portion 15) including the tip 1b of the oxide superconducting wire 1, and is joined to the base material 10 via a soldered layer 44. The stabilized layer 43 of the portion (the other end portion 46) including the other end 4b of the second surface-connecting superconducting wire 4 overlaps a surface 20a of the base material 20 of the portion (the tip portion 25) including the tip 2b of the oxide superconducting wire 2, and is joined to the base material 20 via the soldered layer 44.

A portion at which the one end portion 45 of the second surface-connecting superconducting wire 4 and the tip portion 15 of the oxide superconducting wire 1 are joined is referred to as a joining section 53A, and a region thereof is referred to as a third joining region 53. A portion at which the other end portion 46 of the second surface-connecting superconducting wire 4 and the tip portion 25 of the oxide superconducting wire 2 are joined is referred to as a joining section 54A, and a region thereof is referred to as a fourth joining region 54.

The soldered layer 44 may be formed throughout a surface 43a of the stabilized layer 43 or may be formed at only the joining regions 53 and 54 of the surface 43a. As a metal layer formed of Ag, Cu, or the like is formed on surface regions of the oxide superconducting wires 1 and 2 corresponding to the joining regions 53 and 54 (portions of the surfaces 10*a* and 20*a* of the base materials 10 and 20), the oxide superconducting wires 1 and 2 and the second surface-connecting superconducting wire 4 can be strongly joined via the soldered layer 44. In the joining regions 53 and 54, it is preferable that the second surface-connecting superconducting wire 4 be joined to the oxide superconducting wires 1 and 2 throughout widths thereof.

The second surface-connecting superconducting wire 4 transits and connects the oxide superconducting wires 1 and 2 through connection of the one end portion 45 and the other end portion 46 to the oxide superconducting wires 1 and 2, respectively.

The joining sections 53A and 54A between the second surface-connecting superconducting wire 4 and the oxide superconducting wires 1 and 2 are formed to have tensile strength larger than that of the joining sections 51A and 52A between the first surface-connecting superconducting wire 3 and the oxide superconducting wires 1 and 2. The tensile strength of the joining sections mentioned herein is tensile strength (for example, pursuant to JIS Z2241) in a lengthwise direction (the Y direction) of the first and second oxide superconducting wires 1 and 2.

For comparison of the tensile strength of the joining sections 51A and 52A between the first surface-connecting superconducting wire 3 and the oxide superconducting wires 1 and 2 with the tensile strength of the joining sections 53A and 54A between the second surface-connecting superconducting wire 4 and the oxide superconducting wires 1 and 2, for example, the following method may be used.

A first connecting structure configured to connect the oxide superconducting wires 1 and 2 via the first surface-connecting superconducting wire 3 (a structure in which the second surface-connecting superconducting wire 4 is omitted from the connecting structure 100 of FIG. 1) and a second connecting structure configured to connect the oxide superconducting wires 1 and 2 via the second surface-connecting superconducting wire 4 (a structure in which the first surface-connecting superconducting wire 3 is omitted from the connecting structure 100 of FIG. 1) are prepared.

The first connecting structure and the second connecting structure are provided for a tension test. The tensile strength of the joining sections 51A and 52A of the joining regions 51 and 52 of the first connecting structure (a sum of the tensile strength of the joining region 51 and the tensile strength of the joining region 52) and the tensile strength of the joining sections 53A and 54A of the joining regions 53 and 54 of the second connecting structure (a sum of the tensile strength of the joining region 53 and the tensile strength of the joining region 54) are measured, and the tensile strengths thereof are compared.

It is preferable that the second surface-connecting superconducting wire 4 be formed to be longer than the first surface-connecting superconducting wire 3 in the lengthwise direction (the Y direction) of the oxide superconducting wires 1 and 2.

It is preferable that the joining regions 53 and 54 of the second surface-connecting superconducting wire 4 include the joining regions 51 and 52 of the first surface-connecting superconducting wire 3 in the lengthwise direction (the Y direction) of the oxide superconducting wires 1 and 2. Specifically, the third joining region 53 is longer than the first joining region 51 (i.e., a dimension in the Y direction is larger), and the third joining region 53 includes the first joining region 51 in the lengthwise direction (the Y direction). The fourth joining region 54 is longer than the second joining region 52 (i.e., a dimension in the Y direction is larger), and the fourth joining region 54 includes the second joining region 52 in the lengthwise direction (the Y direction). For this reason, the one end 4*a* of the second surface-connecting superconducting wire 4 is disposed at a position further outside in the lengthwise direction (the Y direction) than one end 3*a* of the first surface-connecting superconducting wire 3 (a position separated from a connecting centerline C1 of the oxide superconducting wires 1 and 2). In addition, the other end 4*b* of the second surface-connecting superconducting wire 4 is disposed at a position further outside in the lengthwise direction (the Y direction) than the other end 3*b* of the first surface-connecting superconducting wire 3.

According to the above-mentioned configuration, a joining area of the second surface transit connector 4 with respect to the oxide superconducting wires 1 and 2 is increased. For this reason, the tensile strength of the joining sections 53A and 54A of the second surface-connecting superconducting wire 4 can be reliably increased to be larger than the tensile strength of the joining sections 51A and 52A of the first surface-connecting superconducting wire 3. Accordingly, an effect of preventing a decrease in a superconduction property can be reliably obtained.

Further, the connecting centerline C1 is a line passing through a center in the lengthwise direction (the Y direction) of the gap between tip surfaces 1*a* and 2*a* of the oxide superconducting wires 1 and 2 and perpendicular to the oxide superconducting wires 1 and 2.

The first surface-connecting superconducting wire 3 and the second surface-connecting superconducting wire 4 may have the same mechanical property. For example, the tensile strengths in the lengthwise direction of the oxide superconducting wires 1 and 2 (for example, tensile strength pursuant to JIS Z2241) may be equal to each other.

[Method of Manufacturing Connecting Structure]

Figure 3:
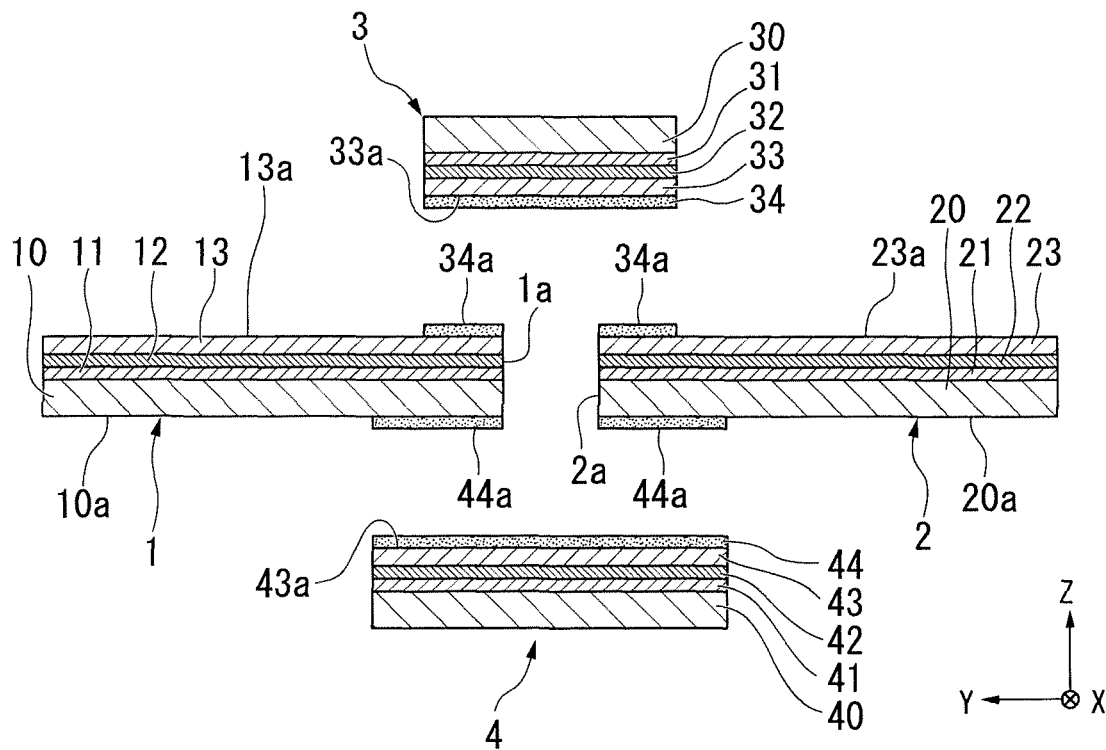
FIG. 3 is a view schematically showing a method of manufacturing the connecting structure of FIG. 1.

As shown in FIG. 3, the connecting structure 100 may be manufactured using the following method.

(First Process)

The oxide superconducting wires 1 and 2, the first surface-connecting superconducting wire 3 and the second surface-connecting superconducting wire 4 are prepared.

(Second Process)

The oxide superconducting wires 1 and 2 are disposed so that the tip surfaces 1*a* and 2*a* face to each other.

(Third Process)

The soldered layers 34 and 44 are formed on the surface 33*a* of the stabilized layer 33 of the first surface-connecting superconducting wire 3 and the surface 43*a* of the stabilized layer 43 of the second surface-connecting superconducting wire 4. It is preferable that a preliminary soldered layer 34*a* be formed on surface regions of the oxide superconducting wires 1 and 2 corresponding to the joining regions 51 and 52 (see FIG. 1) (portions of the surfaces 13*a* and 23*a* of the stabilized layers 13 and 23). It is preferable that a preliminary soldered layer 44*a* be formed on the surface regions of the oxide superconducting wires 1 and 2 corresponding to the joining regions 53 and 54 (see FIG. 1) (portions of the surfaces 10*a* and 20*a* of the base materials 10 and 20) after depositing Ag, Cu, or the like, through vapor deposition.

The first surface-connecting superconducting wire 3 overlaps the first surfaces (the surfaces 13*a* and 23*a* of the stabilized layers 13 and 23) to be joined to the stabilized layers 13 and 23 by the soldered layer 34 to extend over the oxide superconducting wires 1 and 2. Accordingly, the oxide superconducting wires 1 and 2 are connected by the first surface-connecting superconducting wire 3.

The second surface-connecting superconducting wire 4 overlaps the second surfaces (the surfaces 10a and 20a of the base materials 10 and 20) to be joined to the base materials 10 and 20 by the soldered layer 44 to extend over the oxide superconducting wires 1 and 2.

Further, either of the joining of the first surface-connecting superconducting wire 3 and the joining of the second surface-connecting superconducting wire 4 with respect to the oxide superconducting wires 1 and 2 may be previously performed or both of them may be simultaneously performed.

The connecting structure 100 shown in FIG. 1 is obtained through the above-mentioned process.

In the connecting structure 100, the first surface-connecting superconducting wire 3 is provided on one surface of the oxide superconducting wires 1 and 2, and the second surface-connecting superconducting wire 4 is installed on the other surface of the oxide superconducting wires 1 and 2. For this reason, a deviation in structure in a thickness direction of the oxide superconducting wires 1 and 2 is reduced.

Figure 4A:
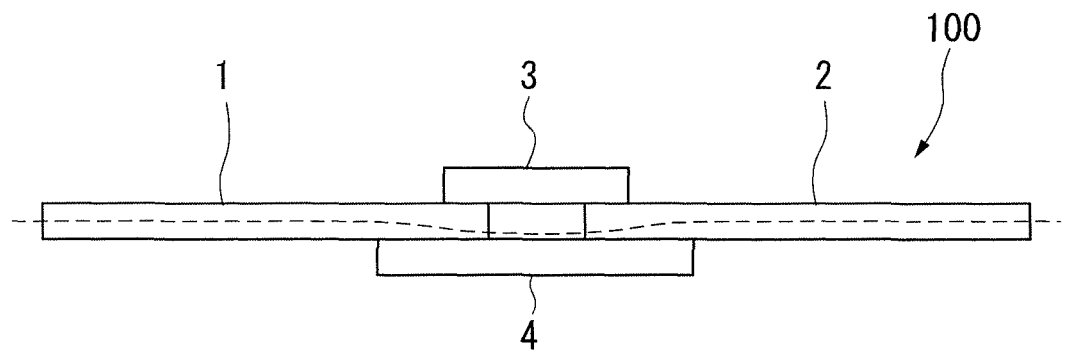
FIG. 4A is a view showing a position of a center of gravity in a thickness direction of the connecting structure of the oxide superconducting wire shown in FIG. 1.
Figure 4B:
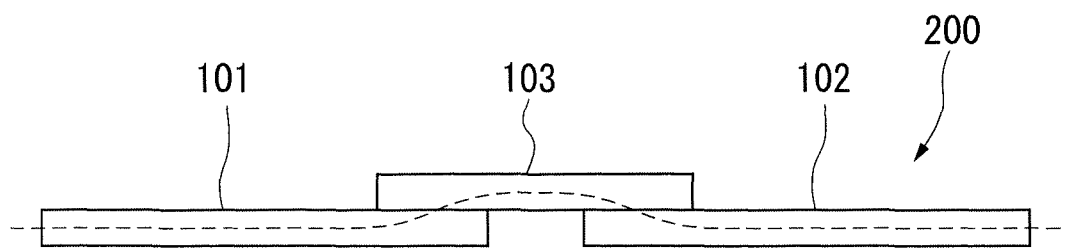
FIG. 4B is a view showing a position of a center of gravity in a thickness direction of an example of a connecting structure of an oxide superconducting wire of the related art.
Figure 13A:
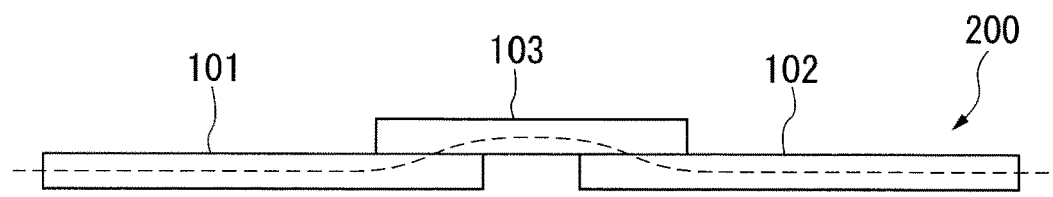
FIG. 13A is a view showing an example of the connecting structure.
Figure 13B:
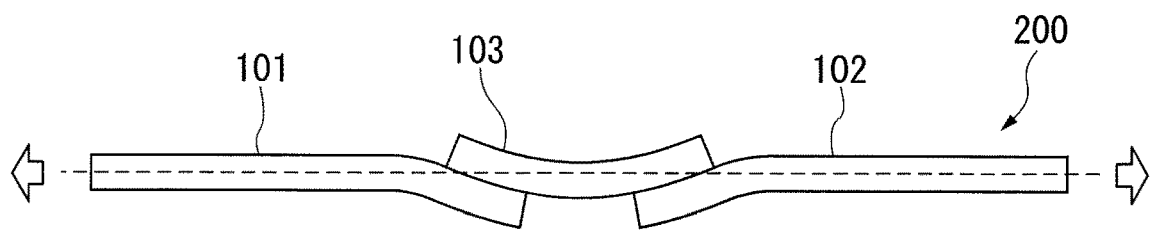
FIG. 13B is a view for describing a variation in shape of the connecting structure when a tensile force is applied to the connecting structure of FIG. 13A.

FIG. 4A is a view showing a position of a center of gravity in the thickness direction of the connecting structure 100. As shown in FIG. 4A, in the connecting structure 100, the position (a broken line) of the center of gravity of the connecting portion is closer to a center in the thickness direction than the connecting structure 200 shown in FIG. 4B (see FIG. 13 and FIG. 14). For this reason, in the connecting structure 100, stress concentration and folding of the wire are reduced even when the tensile load is applied, and a decrease in a superconduction property can be prevented.

As described above, in the connecting structure 100, the tensile strength of the joining sections 53A and 54A of the second surface-connecting superconducting wire 4 is set to be higher than the tensile strength of the joining sections 51A and 52A of the first surface-connecting superconducting wire 3.

Figure 5:
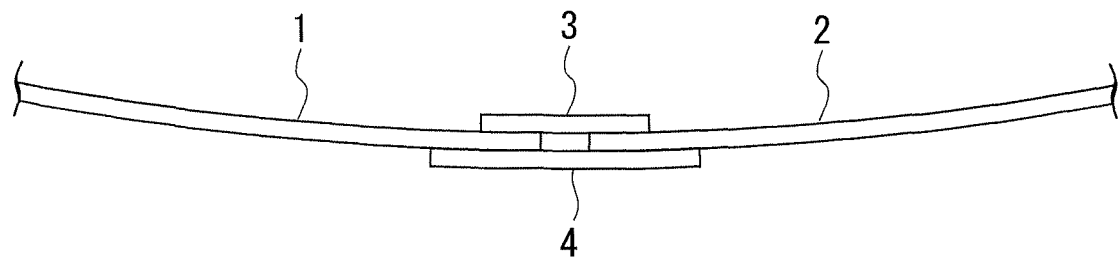
FIG. 5 is a view schematically showing a shape of the connecting structure when the superconducting coil is manufactured using the connecting structure of FIG. 1.

As shown in FIG. 5, when the superconducting coil is manufactured using the connecting structure 100, conventionally, the first surface of the oxide superconducting wires 1 and 2 (a surface on which the first surface-connecting superconducting wire 3 is installed) is used as an inner circumferential surface and the connecting structure 100 is wound in a coil shape.

For this reason, a tensile force larger than that of the inner circumferential surface may be applied to the second surface serving as the outer circumferential surface of the connecting structure 100. However, in the connecting structure 100, the tensile strength of the joining sections 53A and 54A of the second surface-connecting superconducting wire 4 is set to be high. For this reason, a decrease in a superconduction property can be prevented without causing damage to the connecting portion even when the tensile load is applied to the connecting structure 100 while it is wound in the coil shape.

On the other hand, when the tensile strength of the joining section of the second surface-connecting superconducting wire is equal to or smaller than the tensile strength of the joining section of the first surface-connecting superconducting wire, if the tensile load is applied to the connecting structure in the coil shape, damage is likely to occur as a large force is applied to the joining section of the second surface-connecting superconducting wire of the outer circumferential surface side.

In the connecting structure 100, since the gap 5 is provided between the tip surface 1a and the tip surface 2a, distortion can be absorbed by the gap 5 when the bending is applied to the connecting structure 100. For this reason, an excessive force is not applied to the connecting portion, and the damage can be avoided.

In addition, in the connecting structure 100, the second surface-connecting superconducting wire 4 is used as the second surface transit connector. The oxide superconducting wire having the same configuration as the oxide superconducting wires 1 and 2 and the first surface-connecting superconducting wire 3 can be used as the second surface-connecting superconducting wire 4. For this reason, kinds of components can be reduced, and manufacturing thereof becomes easy.

According to the method of manufacturing the connecting structure 100, stress concentration and bending of the wire are reduced even when the tensile load is applied, and the connecting structure 100 capable of preventing a decrease in a superconduction property can be easily manufactured.

First Variant of Connecting Structure According to First Embodiment

Hereinafter, the above-mentioned components are designated by the same reference numerals and description thereof will be omitted.

While nothing is filled in the gap 5 between the tip surface 1a and the tip surface 2a of the oxide superconducting wires 1 and 2 in the connecting structure 100 shown in FIG. 1, a conductive material may be filled in the gap 5.

Figure 6:
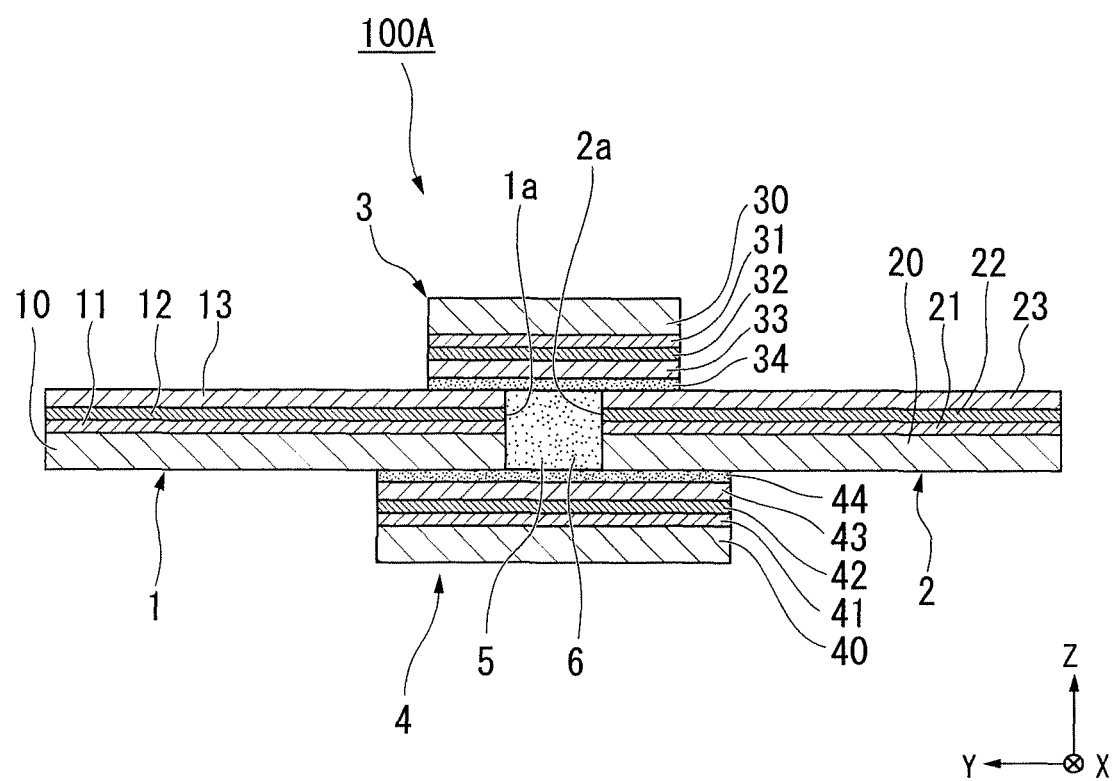
FIG. 6 is a cross-sectional view schematically showing a first variant of the connecting structure of FIG. 1 in a lengthwise direction.

FIG. 6 is a view showing the connecting structure 100A serving as a first variant of the connecting structure 100. The connecting structure 100A is distinguished from the connecting structure 100 shown in FIG. 1 in that a conductive material 6 such as soldering or the like is filled in the gap 5.

The connecting structure 100A is better than the connecting structure 100 shown in FIG. 1 in conductivity between the oxide superconducting wire 1 and the oxide superconducting wire 2 because the conductive material 6 is filled in the gap 5.

Second Variant of Connecting Structure of First Embodiment

While the gap 5 is secured between the tip surface 1a and the tip surface 2a of the oxide superconducting wires 1 and 2 in the connecting structure 100 shown in FIG. 1, the gap 5 may not be provided.

Figure 7:
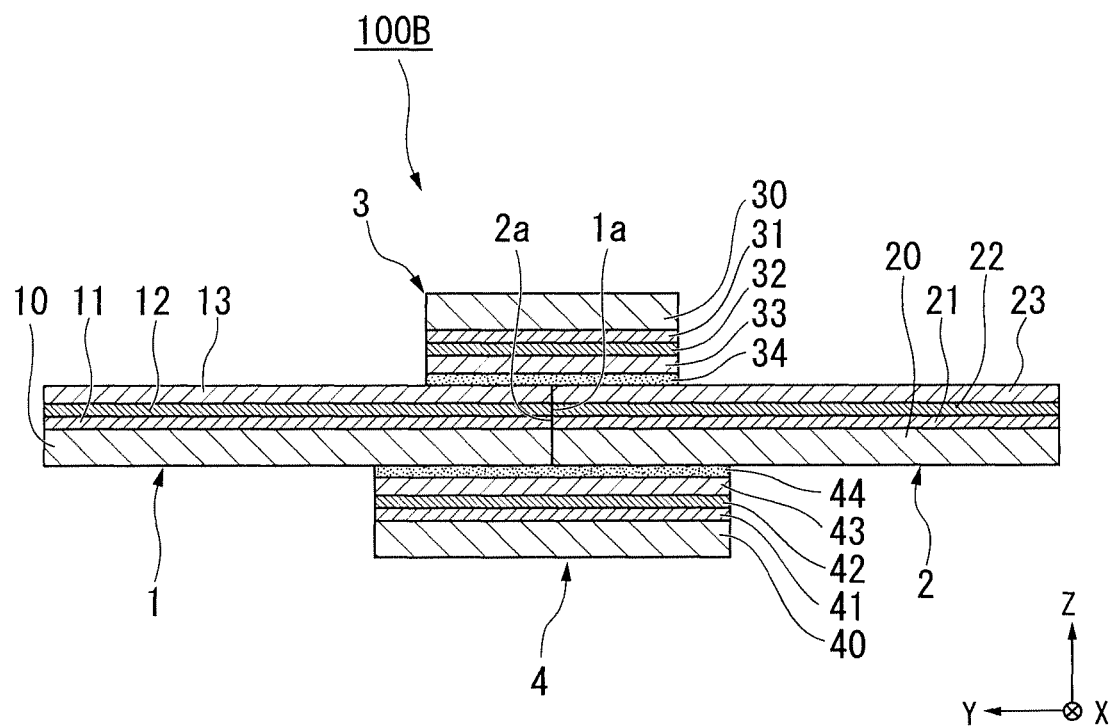
FIG. 7 is a cross-sectional view schematically showing a second variant of the connecting structure of FIG. 1 in the lengthwise direction.

FIG. 7 is a view showing a connecting structure 100B serving as a second variant of the connecting structure 100. In the connecting structure 100B, the tip surface 1a and the tip surface 2a abut each other, and there is no gap between the tip surface 1a and the tip surface 2a.

The connecting structure 100B has larger contact areas between the oxide superconducting wires 1 and 2, and the first surface-connecting superconducting wire 3, and the oxide superconducting wires 1 and 2 and the second surface-connecting superconducting wire 4 than the connecting structure 100 shown in FIG. 1. For this reason, it is advantageous in securement of connecting reliability.

[Third Variant of Connecting Structure of First Embodiment]

Figure 8:
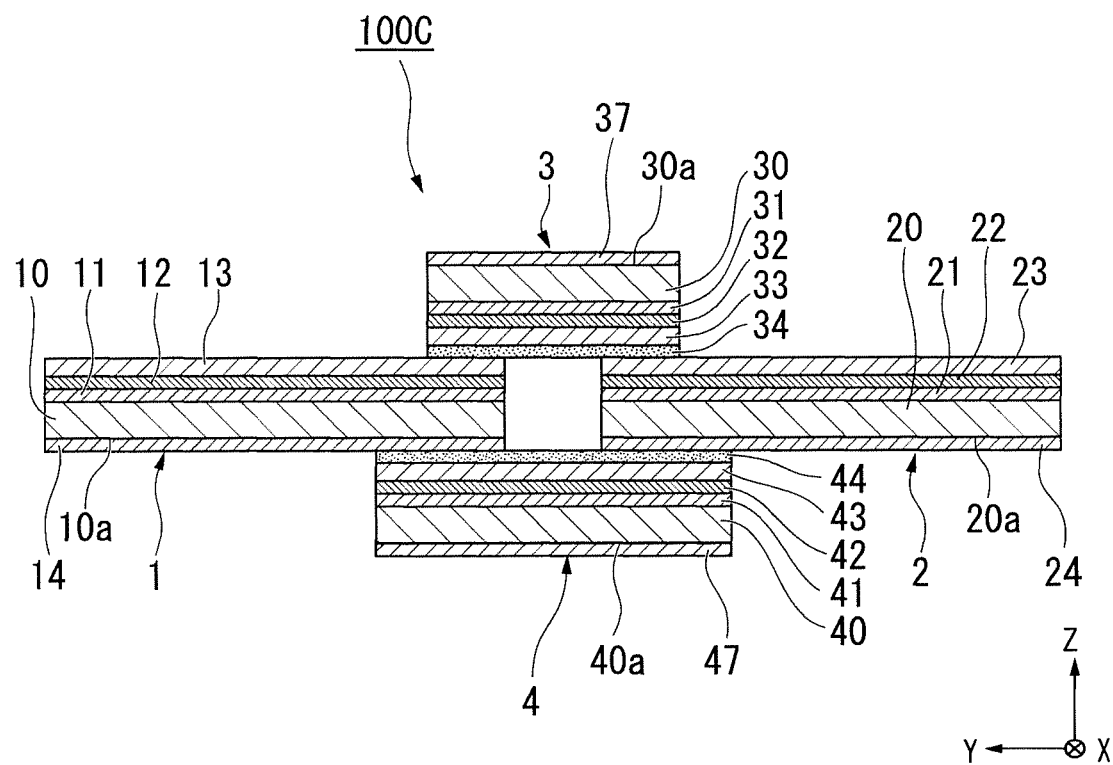
FIG. 8 is a cross-sectional view schematically showing a third variant of the connecting structure of FIG. 1 in the lengthwise direction.

FIG. 8 is a view showing a connecting structure 100C serving as a third variant of the connecting structure 100. The connecting structure 100C has stabilized layers 14 and 24 formed on the surfaces 10a and 20a of the base materials 10 and 20 of the oxide superconducting wires 1 and 2, respectively. The stabilized layers 14 and 24 are formed of, for example, Cu or a Cu alloy (a Cu—Zn alloy, a Cu—Ni alloy, or the like).

Stabilized layers 37 and 47 may also be formed on surfaces 30a and 40a of the base materials 30 and 40 of the first surface-connecting superconducting wire 3 and the second surface-connecting superconducting wire 4, respectively. The stabilized layers 37 and 47 may employ the same configurations as the stabilized layers 14 and 24.

In the connecting structure 100C, the stabilized layers 14 and 24 are formed on the oxide superconducting wires 1 and 2. For this reason, conductivity between the oxide superconducting wires 1 and 2 and the second surface-connecting superconducting wire 4 can be increased.

[Connecting Structure of Second Embodiment]

A connecting structure 110 serving as a connecting structure of an oxide superconducting wire according to a second embodiment of the present invention will be described with reference to FIG. 9.

Figure 9:
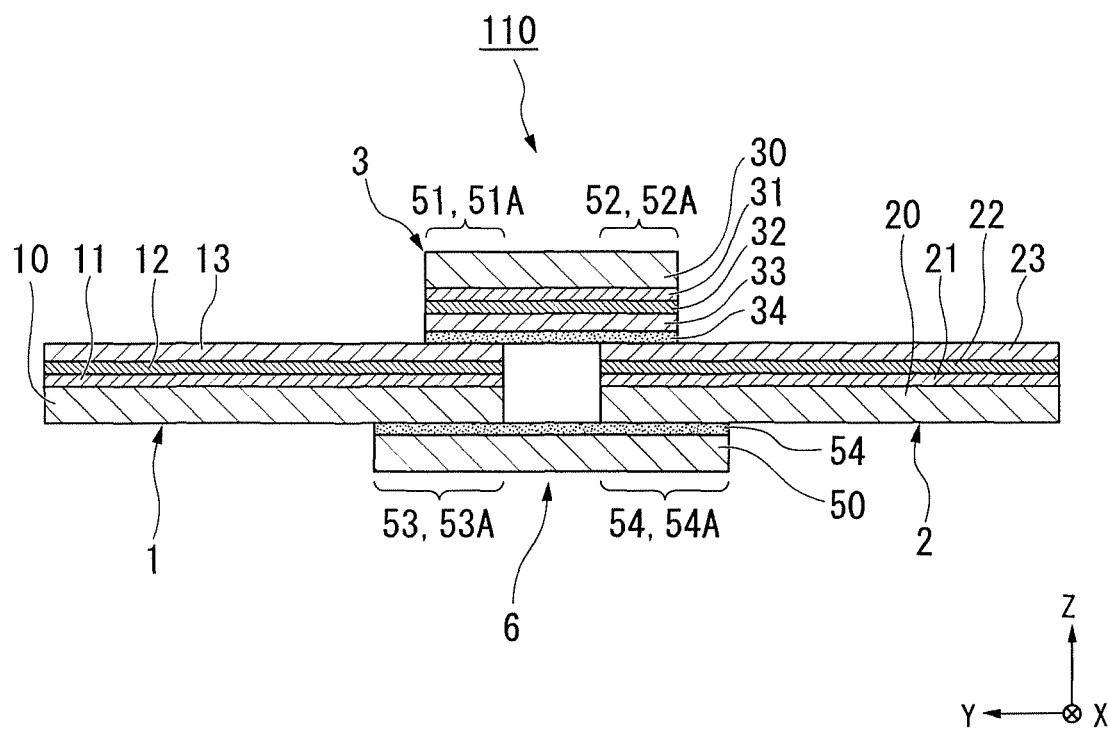
FIG. 9 is a cross-sectional view schematically showing a connecting structure of an oxide superconducting wire according to a second embodiment of the present invention in the lengthwise direction.

As shown in FIG. 9, in the connecting structure 110, a second surface transit connector 6 having a single layer structure is used instead of the second surface-connecting superconducting wire 4. The second surface transit connector 6 is formed of a metal foil or the like. For example, stainless steel, a nickel alloy (Hastelloy or the like), a titanium alloy, copper, or the like, may be exemplified as a material of the second surface transit connector 6.

The second surface transit connector 6 is joined to the surfaces 10a and 20a of the base materials 10 and 20 of the oxide superconducting wires 1 and 2 via a soldered layer 54. The second surface transit connector 6 may be thinner than the first surface-connecting superconducting wire 3. For example, when the second surface transit connector 6 is formed of the same material (for example, Hastelloy) as the base material 30 of the first surface-connecting superconducting wire 3, by appropriately selecting the thickness of the second surface transit connector 6 within a range of larger than the thickness of the base material 30 and smaller than the thickness of the first surface-connecting superconducting wire 3, the second surface transit connector 6 can be thinned without decreasing the strength in comparison with the first surface-connecting superconducting wire 3.

The tensile strength of the joining sections 53A and 54A between the second surface transit connector 6 and the oxide superconducting wires 1 and 2 is set to be larger than the tensile strength of the joining sections 51A and 52A between the first surface-connecting superconducting wire 3 and the oxide superconducting wires 1 and 2.

It is preferable that the joining regions 53 and 54 of the second surface transit connector 6 with respect to the oxide superconducting wires 1 and 2 include the joining regions 51 and 52 of the first surface-connecting superconducting wire 3 in the lengthwise direction (the Y direction) of the oxide superconducting wires 1 and 2. Further, the joining regions 51 and 52 and the joining regions 53 and 54 may have ranges in the lengthwise direction that coincide with each other.

In the connecting structure 110, since the second surface transit connector 6 having the single layer structure is used, the second surface transit connector 6 having high strength/high stiffness and a small thickness can be used, and thus the connecting structure 100 can be thinned while securing the connecting strength.

Other Example of Oxide Superconducting Wire

Figure 10:
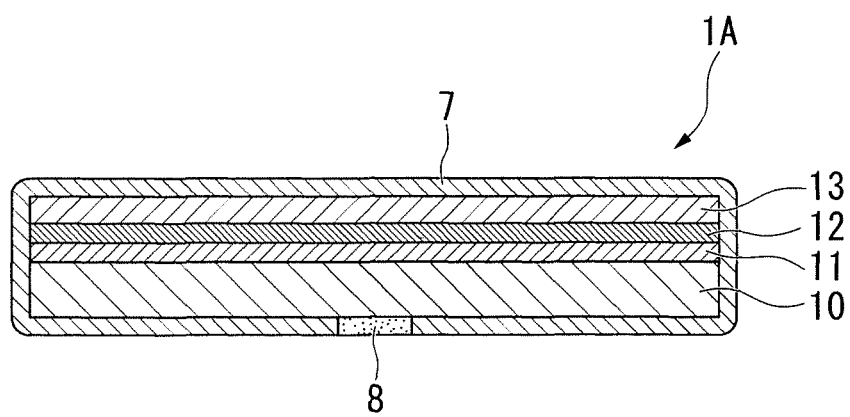
FIG. 10 is a cross-sectional view schematically showing the oxide superconducting wire capable of being used in the connecting structure according to the embodiment of the present invention in a direction perpendicular to the lengthwise direction.

As shown in FIG. 10, a structure in which an outer circumference stabilized layer 7 is formed on the outer circumferential surface in addition to the stabilized layer 13 may be employed in the oxide superconducting wire. In this case, the stabilized layer 13 may be only the first layer formed of Ag or an Ag alloy.

The outer circumference stabilized layer 7 shown in FIG. 10 is formed to cover substantially the entire circumference of the oxide superconducting wire 1 in a C-shaped cross section. The outer circumference stabilized layer 7 may be constituted by a metal tape formed of, for example, Cu or a Cu alloy (Cu—Zn alloy, Cu—Ni alloy, or the like). The metal tape is joined to the outer circumferential surface of the oxide superconducting wire 1 by soldering. A soldered layer 8 is formed on a portion that is not covered by the metal tape (i.e., between side edge portions of the metal tape) by filling a molten solder.

The outer circumference stabilized layer 7 may be formed by enclosing and folding the metal tape from the stabilized layer 13 side (the oxide superconducting layer 12 side) to form a C-shaped cross section.

Further, the outer circumference stabilized layer may be configured by plating.

EXAMPLE

Hereinafter, examples are provided and the present invention will be described in more detail. Further, the present invention is not limited to these examples.

(Manufacture of Sample)

An intermediate layer was formed on a surface of a base material which is formed of Hastelloy C-276 (Product name of Hanes Inc. in the US) in a tape shape and has a width of 12 mm, a thickness of 0.075 mm and a length of 5000 mm.

The intermediate layer was formed of an $Al_2O_3$ layer (a diffusion prevention layer; a thickness of 100 nm) formed by an ion beam sputtering method, a $Y_2O_3$ layer (a bed layer; a thickness of 30 nm) formed by the ion beam sputtering method, a MgO layer (a biaxially-textured layer; a thickness of 5 to 10 nm) formed by an ion beam assisted vapor deposition method (an IBAD method), and a $CeO_2$ layer (a cap layer; a thickness of 500 nm) formed by a pulse laser vapor deposition method (a PLD method).

Next, a $GdBa_2Cu_3O_{7-x}$ layer (an oxide superconducting layer; a thickness of 2.0 μm) was formed on the surface of the intermediate layer by the PLD method. Next, a stabilized layer having an Ag layer (a first layer; a thickness of 2 μm) formed by the DC sputtering method and a Cu layer (a second layer; a thickness of 20 μm) formed by a tape material was formed on the surface of the oxide superconducting layer to obtain a sample. When the stabilized layer was formed, oxygen annealing processing was performed at 500° C. for 10 hours after formation of the Ag layer, and then the Cu layer was formed.

Example 1

The connecting structure 100 shown in FIG. 1 was manufactured as described below.

As shown in FIG. 1, the oxide superconducting wires 1 and 2 were disposed so that the tip surfaces 1a and 2a faces to each other, respectively. The first surface-connecting superconducting wire 3 overlapped the first surfaces (the surfaces 13a and 23a of the stabilized layers 13 and 23) to extend over the oxide superconducting wires 1 and 2 and was joined to the stabilized layers 13 and 23 by the soldered layer 34.

The second surface-connecting superconducting wire 4 overlapped the second surfaces (the surfaces 10a and 20a of the base materials 10 and 20) to extend over the oxide superconducting wires 1 and 2 and was joined to the base materials 10 and 20 by the soldered layer 44.

The oxide superconducting wires obtained from the above-mentioned samples were used as the oxide superconducting wires 1 and 2, the first surface-connecting superconducting wire 3 and the second surface-connecting superconducting wire 4.

The connecting structure 100 shown in FIG. 1 was obtained through the above-mentioned process.

Figure 11:
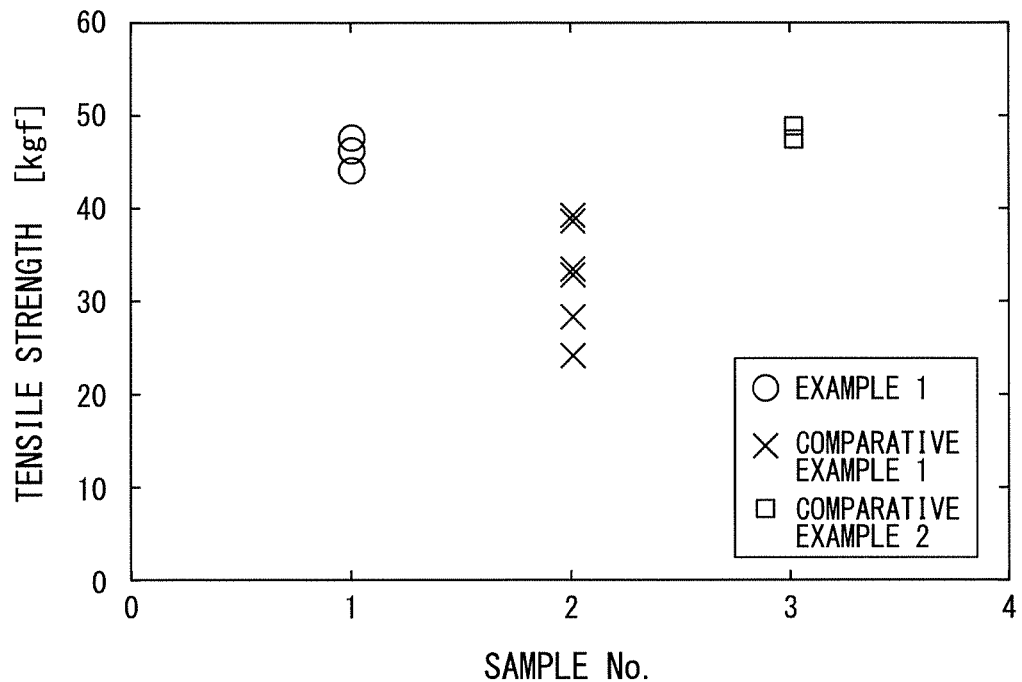
FIG. 11 is a graph showing test results.

The end portions of the oxide superconducting wires 1 and 2 were gripped to apply the tensile force in the lengthwise direction (the Y direction) to the connecting structure 100 and the tensile strength was measured using a tension test apparatus. The result is shown in FIG. 11.

Comparative Example 1

The connecting structure 200 shown in FIG. 14A was manufactured as described below.

The oxide superconducting wires 101 and 102 were disposed so that tip surfaces thereof face to each other. The first surface-connecting superconducting wire 103 was deposited on the first surfaces of the oxide superconducting wires 101 and 102 (the surfaces of the stabilized layers 13 and 23) and joined to the stabilized layers 13 and 23 by the soldered layer 34.

The oxide superconducting wires obtained from the above-mentioned samples were used as the oxide superconducting wires 101 and 102 and the first surface-connecting superconducting wire 103.

Figure 14A:
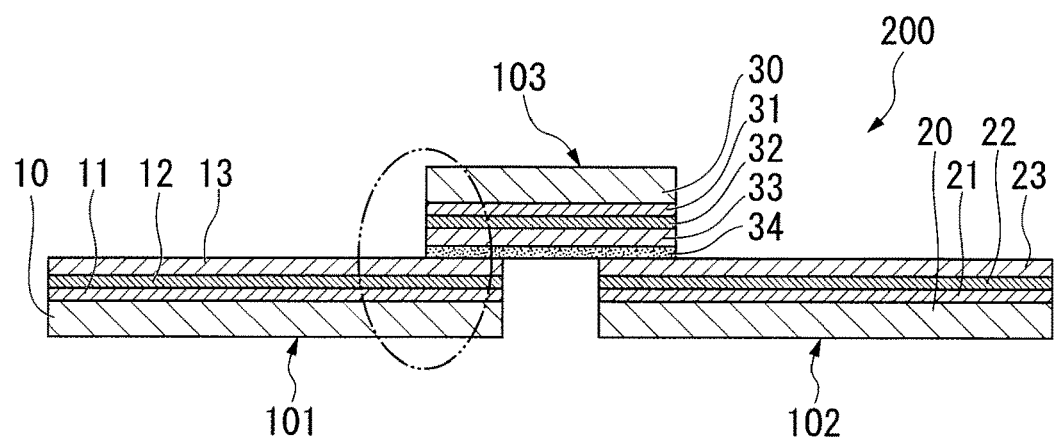
FIG. 14A is a cross-sectional view schematically showing an example of the connecting structure.
Figure 14B:
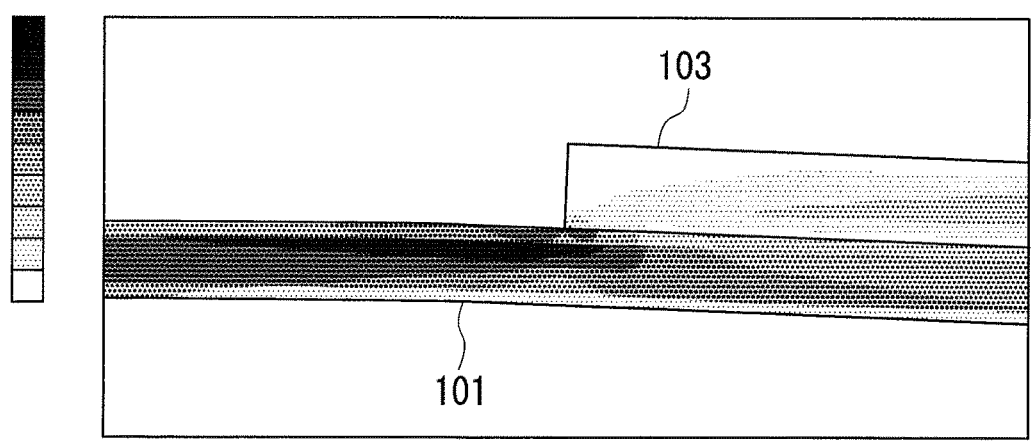
FIG. 14B is a view showing stress in the connecting portion when the tensile load is applied to the connecting structure of FIG. 14A.

The connecting structure 200 shown in FIG. 14A was obtained through the above-mentioned process.

The tensile force in the lengthwise direction (the Y direction) was applied to the connecting structure 200 and the tensile strength was measured. The result is shown in FIG. 11.

Comparative Example 2

For comparison, the tensile strength of the oxide superconducting wire obtained from the above-mentioned sample (the oxide superconducting wire with no connecting structure) was measured. The result is shown in FIG. 11.

As shown in FIG. 11, in Example 1 in which the second surface-connecting superconducting wire 4 was formed on the second surfaces of the oxide superconducting wires 1 and 2, tensile strength higher than that of Comparative Example 1 in which the second surface-connecting superconducting wire 4 was not used was obtained.

The tensile strength in Example 1 was substantially the same as the oxide superconducting wire (Comparative Example 2) with no connecting structure.

Example 2

The connecting structure 100 shown in FIG. 1 was manufactured. The length of the first surface-connecting superconducting wire 3 (the length in the Y direction) and the length of the second surface-connecting superconducting wire 4 (the length in the Y direction) are represented in Table 1.

The oxide superconducting wires obtained from the above-mentioned samples were used as the oxide superconducting wires 1 and 2, the first surface-connecting superconducting wire 3 and the second surface-connecting superconducting wire 4.

Ic deterioration distortion of the connecting structure 100 was measured. The result is shown in Table 1 and FIG. 12.

Reference Example 1

The same connecting structure as Example 2 was manufactured except that the length of the second surface-connecting superconducting wire 4 (the length in the Y direction) was that represented in Table 1. Ic deterioration distortion of the connecting structure was measured. The result is shown in Table 1 and FIG. 12.

Comparative Example 3

The same connecting structure as Example 2 was manufactured except that the length of the second surface-connecting superconducting wire 4 (the length in the Y direction) was that represented in Table 1. Ic deterioration distortion of the connecting structure was measured. The result is shown in Table 1 and FIG. 12.

TABLE 1

| | Length of first surface-connecting superconducting wire rod [mm] | Length of second surface-connecting superconducting wire rod [mm] | Ic deterioration distortion [%] |
|---|---|---|---|
| Example 2 | 55 | 65 | 0.468 |
| Reference example 1 | 55 | 55 | 0.469 |
| Comparative example 3 | 55 | 45 | 0.294 |

Figure 12:
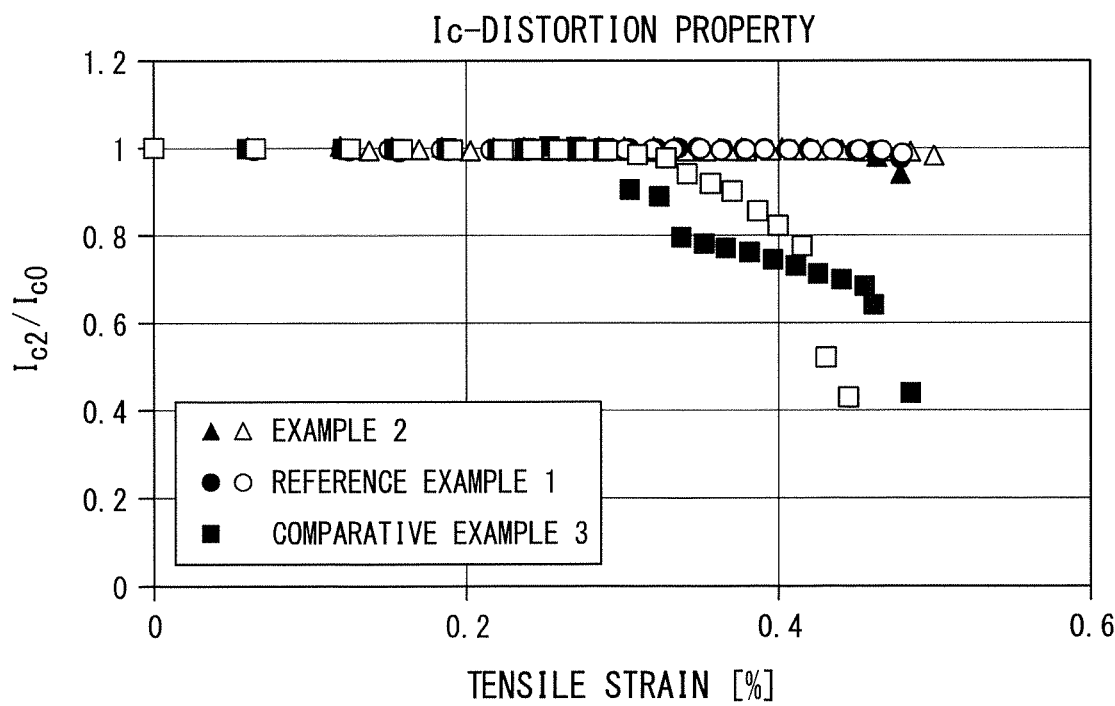
FIG. 12 is a graph showing test results.

As shown in FIG. 12, in comparison with Comparative Example 3 in which the second surface-connecting superconducting wire 4 is shorter than the first surface-connecting superconducting wire 3, in Example 2 in which the second surface-connecting superconducting wire 4 is longer than the first surface-connecting superconducting wire 3, a result in which Ic deterioration distortion is good is obtained.

According to the results shown in FIG. 11, Table 1 and FIG. 12, it was confirmed that the connecting structure 100 in which the second surface-connecting superconducting wire 4 is longer than the first surface-connecting superconducting wire 3 has superiority.

While various embodiments of the present invention have been described above, components of the embodiments, combinations thereof, and so on, are exemplarily provided, and additions, omissions, substitutions and other modifications may be made without departing from the spirit of the present invention.

For example, the oxide superconducting wire is not limited to the RE-123-based superconducting wire but may be a Bi-based superconducting wire.

In addition, in the connecting structure 100, while the oxide superconducting wires 1 and 2, the first surface-connecting superconducting wire 3 and the second surface-connecting superconducting wire 4 have the intermediate layers 11, 21, 31 and 41, the intermediate layer may be unnecessary. For this reason, the oxide superconducting wire may have a configuration in which the oxide superconducting layer and the stabilized layer are sequentially deposited on the base material. In addition, in the connecting structure 100, it is preferable that the joining regions 53 and 54 include the joining regions 51 and 52 when seen in a plan view.

DESCRIPTION OF REFERENCE NUMERAL

1 First oxide superconducting wire 1a Tip surface 2 Second oxide superconducting wire 2a Tip surface 3 First surface-connecting superconducting wire 4 Second surface-connecting superconducting wire (second surface transit connector) 5 Gap 6 Second surface transit connector 10, 20, 30, 40 Base material 12, 22, 32, 42 Oxide superconducting layer 13, 23, 33, 43 Stabilized layer 51, 52, 53, 54 Joining region 51A, 52A, 53A, 54A Joining section

The invention claimed is:

1. A connecting structure of an oxide superconducting wire comprising:
    a pair of oxide superconducting wires each having a first oxide superconducting layer and a first stabilized layer, which are sequentially deposited on a first tape-shaped base material, tip surfaces of the pair of oxide superconducting wire being disposed to face each other;
    a first surface-connecting superconducting wire having a second oxide superconducting layer and a second stabilized layer, which are sequentially deposited on a second tape-shaped base material, and configured to transit and connect the pair of oxide superconducting wires; and
    a second surface transit connector configured to transit and connect the pair of oxide superconducting wires,
    wherein the first surface-connecting superconducting wire is joined to the pair of oxide superconducting wires such that the second stabilized layer faces the first stabilized layer of the pair of oxide superconducting wires, the second surface transit connector is joined to the pair of oxide superconducting wires to face the first base material of the pair of oxide superconducting wires, and tensile strength of joining sections between the second surface transit connector and the pair of oxide superconducting wires is higher than tensile strength of joining sections between the first surface-connecting superconducting wire and the pair of oxide superconducting wires,
    wherein the second surface transit connector is an oxide superconducting wire having a third oxide superconducting layer and a third stabilized layer, which are sequentially deposited on a third tape-shaped base material, and
    wherein the second surface transit connector is formed to be longer than the first surface-connecting superconducting wire in a lengthwise direction of the pair of oxide superconducting wires, and both end portions of the joining regions of the second surface transit connector with respect to the pair of oxide superconducting wires are disposed further outside than both end portions of the joining regions of the first surface-connecting superconducting wire with respect to the pair of oxide superconducting wires in the lengthwise direction of the pair of oxide superconducting wires.

2. The connecting structure of the oxide superconducting wire according to claim 1, wherein
    the tip surfaces of the pair of oxide superconducting wires are disposed to face each other with a gap.

3. A method of manufacturing a connecting structure of an oxide superconducting wire, the method comprising:
    preparing a pair of oxide superconducting wires each having a first oxide superconducting layer and a first stabilized layer, which are sequentially deposited on a first tape-shaped base material, a first surface-connecting superconducting wire having a second oxide superconducting layer and a second stabilized layer, which are sequentially deposited on a second tape-shaped base material, and a second surface transit connector;
    disposing the pair of oxide superconducting wires such that tip surfaces thereof face each other;
    joining the first surface-connecting superconducting wire to the pair of oxide superconducting wires such that the second stabilized layer faces the first stabilized layer of the pair of oxide superconducting wires;
    joining the second surface transit connector to the pair of oxide superconducting wires to face to the first base material of the pair of oxide superconducting wires; and
    setting tensile strength of joining sections between the second surface transit connector and the pair of oxide superconducting wires to be larger than tensile strength of joining sections between the first surface-connecting superconducting wire and the pair of oxide superconducting wires, when the first surface-connecting superconducting wire and the second surface transit connector are joined to the pair of oxide superconducting wires,
    wherein the second surface transit connector is an oxide superconducting wire having a third oxide superconducting layer and a third stabilized layer, which are sequentially deposited on a third tape-shaped base material, and
    wherein the second surface transit connector is formed to be longer than the first surface-connecting superconducting wire in a lengthwise direction of the pair of oxide superconducting wires, and both end portions of the joining regions of the second surface transit connector with respect to the pair of oxide superconducting wires are disposed further outside than both end portions of the joining regions of the first surface-connecting superconducting wire with respect to the pair of oxide superconducting wires in the lengthwise direction of the pair of oxide superconducting wires.

4. The method according to claim 3, wherein
    the tip surfaces of the pair of oxide superconducting wires are disposed to face each other with a gap.

* * * * *